United States Patent
Pierson

[11] Patent Number: 6,027,006
[45] Date of Patent: Feb. 22, 2000

[54] METHOD AND APPARATUS FOR APPLYING SOLDER AND FORMING SOLDER BALLS ON A SUBSTRATE

[75] Inventor: Mark Vincent Pierson, Binghamton, N.Y.

[73] Assignee: International Business Machines Corporation, Armonk, N.Y.

[21] Appl. No.: 09/103,864

[22] Filed: Jun. 24, 1998

[51] Int. Cl.[7] .................................................. B23K 3/00
[52] U.S. Cl. ............................... 228/33; 228/39; 228/43; 118/58
[58] Field of Search ................................. 228/33, 36, 39, 228/43, 248.1, 256; 427/96; 118/58; 101/35, 126; 198/418.1, 525, 540; 141/32; 99/450.6

[56] References Cited

U.S. PATENT DOCUMENTS

| | | |
|---|---|---|
| 3,613,635 | 10/1971 | Brehm . |
| 3,906,850 | 9/1975 | Papai ...................................... 99/450.7 |
| 3,919,973 | 11/1975 | Zimmer . |
| 4,342,342 | 8/1982 | Wheadon ................................. 141/1.1 |
| 4,557,194 | 12/1985 | Zimmer . |
| 4,604,966 | 8/1986 | Kohn . |
| 4,649,816 | 3/1987 | Gasper et al. . |
| 4,953,460 | 9/1990 | Wojcik . |
| 5,151,132 | 9/1992 | Zimmer . |
| 5,244,143 | 9/1993 | Ference et al. . |
| 5,360,481 | 11/1994 | Ludwig . |
| 5,395,643 | 3/1995 | Brown et al. . |
| 5,409,157 | 4/1995 | Nagesh et al. . |
| 5,431,332 | 7/1995 | Kirby et al. . |
| 5,551,979 | 9/1996 | Shealey ..................................... 118/70 |
| 5,655,704 | 8/1997 | Sakemi et al. . |

*Primary Examiner*—Samuel M. Heinrich
*Attorney, Agent, or Firm*—William N. Hogg

[57] ABSTRACT

A method and apparatus is disclosed for applying solder to a substrate which has a predetermined pattern of receiving pads thereon and forming solder balls from the applied solder. A conveyor is provided having a support member and a continuous metering member. The metering member has openings thereon arranged in the same preselected pattern as the solder receiving pads on the substrate. The substrate is moved into contact with the support member and the metering member, the openings in the metering member being in alignment with the solder receiving pads of the substrate. A container of solder is provided which supplies solder to the openings. The solder may be in liquid form, or in paste form, or in the form of solid solder balls. The applied solder, if in the form of paste or solid balls is melted. Thereafter, the solder is solidified on the pads to form solder balls, and the substrate is discharged from the conveyor with the solidified solder balls thereon.

8 Claims, 3 Drawing Sheets

METHOD AND APPARATUS FOR APPLYING SOLDER AND FORMING SOLDER BALLS ON A SUBSTRATE

FIELD OF THE INVENTION

This invention relates generally to a method and apparatus for applying solder balls to a substrate, and more particularly to a method and apparatus for continuously applying solder balls to a substrate which has a repeating pattern of pads to which the solder balls are to be applied. The invention is particularly useful in continuously applying solder balls to flexible circuit, although it is useful in applying solder balls to other forms of substrates such as rigid circuit boards on cards.

BACKGROUND OF THE INVENTION

There are only a limited number of ways to add solder to relatively small areas, such as pads on flexible circuits or pads on other types of substrates. One commonly used technique is to screen solder paste onto the contacts formed on a substrate in a conventional screening process. Thereafter, preformed solder balls are adhered to the wet paste using a thin plate having openings therein to locate the solder balls. Thereafter, the thin plate is removed and the solder reflowed to form the solder ball connection to the pad.

Another technique is to use preformed solder balls and a ball holder, and place the substrate having the ball grid array (BGA) pads onto the solder balls. This assembly is then placed in an oven having a suitable atmosphere, such as a hydrogen gas, which can act as a flux and reflowed to join the balls to the pads.

Another technique is to place all of the solder balls in a block, place the substrate over the solder balls and apply short bursts of high current to the ball pads thus melting some solder on the solder balls, thus causing each solder ball to adhere to its respective pad.

While all of these techniques are reasonably successful and provide good solder connections, nevertheless, all of these techniques involve a high degree of handling of multiple parts, including handling of individual solder balls, and involves a batch operation as opposed to a continuous operation. In high volume situations, there needs to be very close process control, and often optical arrangements for monitoring the process. In any event, in high volume, repetitive situations, the batch process together with individual handling of the pieces contributes to a relatively expensive process.

It is therefore ore a principal object of the present invention to provide an improved technique for continuously applying solder balls to a substrate such as a flexible circuit or other type of substrate wherein there are pads provided in a predetermined pattern in which the solder balls are applied.

SUMMARY OF THE INVENTION

According to the present invention, a method and apparatus is provided for applying solder to a substrate which has a predetermined pattern of receiving pads thereon and forming solder balls from the applied solder. A conveyor is provided having a support member and a continuous metering member. The metering member has openings thereon arranged in the same preselected pattern as the solder receiving pads on the substrate. The substrate is moved into contact with the support member and the metering member, the openings in the metering member being in alignment with the solder receiving pads of the substrate. A container of solder is provided which supplies solder to the openings, with the solder being melted onto the pads. Thereafter, the solder is solidified on the pads to form solder balls, and the substrate is discharged from the conveyor with the solidified solder balls thereon.

DESCRIPTION OF THE PREFERRED EMBODIMENTS

Figure 1:
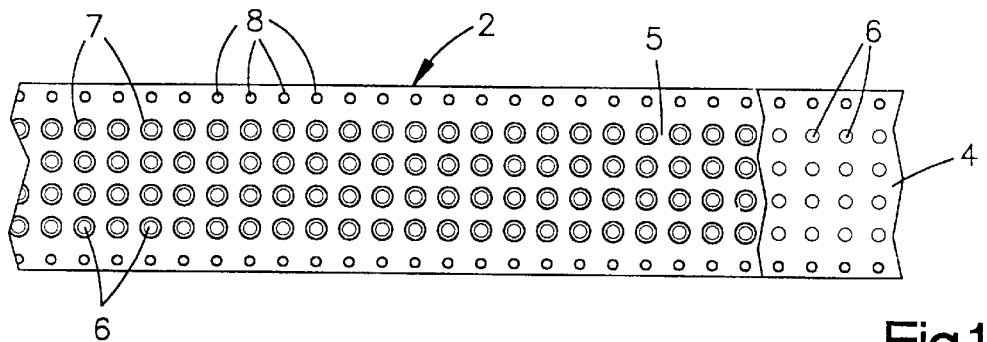
FIG. 1 is a plan view of a flexible circuit on which solder balls are to be applied according to one embodiment of the present invention.
Figure 3:
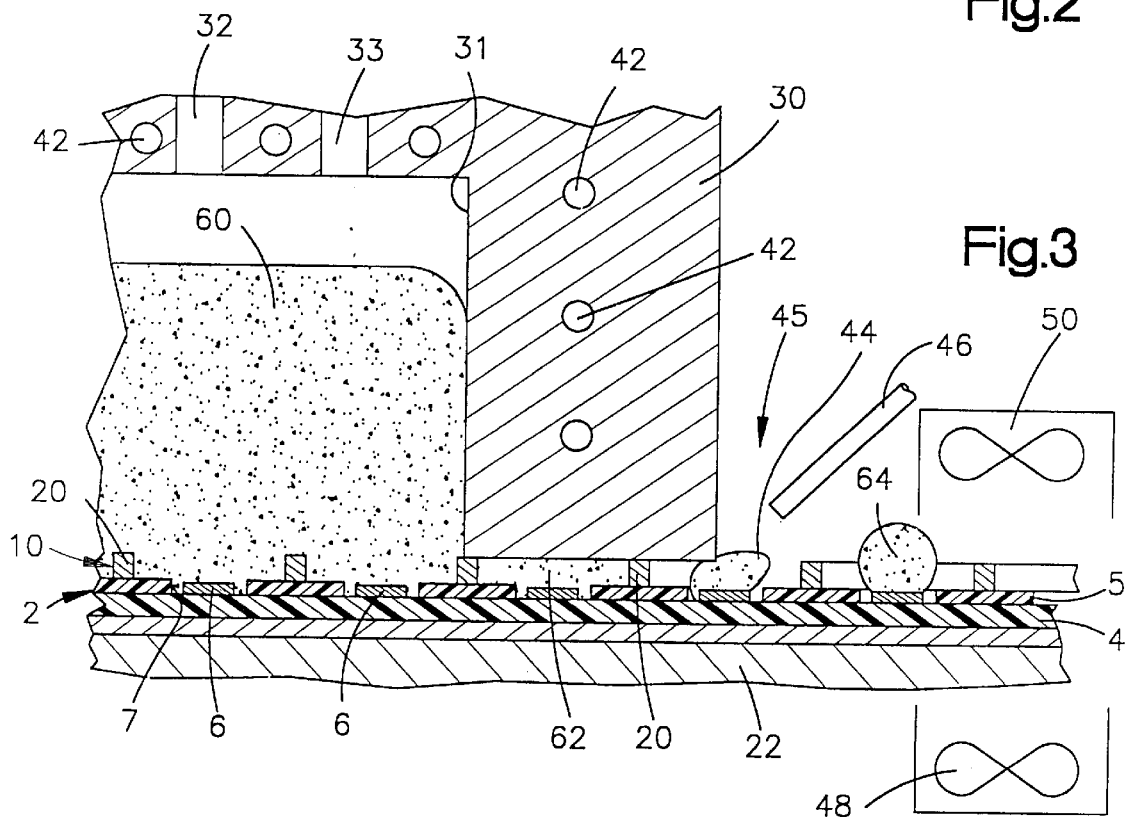
FIG. 3 is a detailed partial sectional view of a portion of the device of FIG. 2 showing the application of solder and forming of the solder balls.

Referring now to the drawings and for the present to FIG. 1, a flexible circuit 2 is provided which is conventional in design and includes a thin film of flexible material 4 on which are provided a thin solder dam layer 5 and electrical contact pads 6 exposed through openings 7 in the solder dam layer 5 (FIG. 3). Other circuitry (not shown) may be provided on the flexible circuit. The pads 6 are arranged in a regular manner, such as in regularly spaced rows of a given number of pads, it being understood that FIG. 1 is illustrative and not limiting as to the arrangement and number of pads. The flexible circuit 2 is also provided with indexing holes 8 for a purpose that will be described presently. The indexing are shown at the outer edges of the flexible circuit 2, but they can be and often are located centrally if there is space there.

Figure 2:
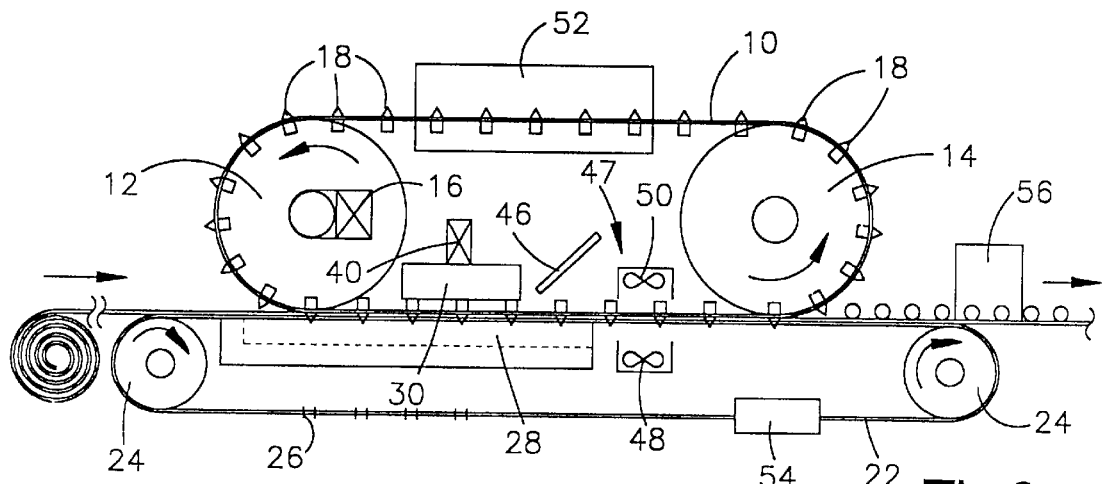
FIG. 2 is a side elevational view, somewhat diagrammatic, showing a device for applying solder and forming solder balls on a flexible circuit according to this invention.

One embodiment of an apparatus for applying and forming solder balls according to the present invention is shown in FIGS. 2 and 3. The device includes a continuous flexible metering band 10 which is reeved around a pair of rolls 12 and 14, roll 12 being an idler roll and roll 14 being a drive roll, with the idler roll 12 being mounted under spring tension 16 to provide a constant tension to the metering band 10. The drive roll 14 is driven by any conventional drive mechanism (not shown) to rotate the band 10 thereon, the roll 12 being driven by friction from the band 10. The metering band 10 is preferably made of a ferromagnetic material, such as 400 series stainless steel, for a purpose which will be described presently. Other non magnetic material can be used, such as titanium, or steel coated with chromium.

The metering band 10 has teeth 18 thereon which are used to index and maintain the flexible circuit 2 in registration therewith. The metering band 10 has metering openings 20 formed therein, which as will be described presently will meter the solder onto the pads 6.

A continuous support band 22 is provided which is reeved around a pair of indirectly driven rolls 24. The support band 22 has indexing holes 26 formed therein, which correspond in spacing and location to the teeth 18 on the meeting band 10. The support band 22 is formed of a non-magnetic material such as 300 series stainless steel, or even non-metallic material such as polyimide (Kapton). A magnet 28 (which may be formed in several parts) is located beneath the bottom of the support band 22 and serves to attract the metering band 10 toward the support band 22.

A solder container 30 (shown in detail in FIG. 3) is provided which includes a solder containing cavity 31 and is located above and in contact with the metering band 10. The solder container 30 has a solder containing cavity 31 and has communicating therewith a solder supply tube 32 and a pressure tube 34. The lower surface 36 of the solder container 30 acts as a wiping surface to assist in metering of the solder, as will be described presently. The solder container 30 is biased into contact with the metering band 10 by means of a bias and spring 40 (FIG. 2) and preferably heaters, which can be cartridge heaters, 42 are disposed within the walls of the solder container 30 to maintain the solder molten therein.

A flux supplying station 44 is provided which has a flux supplying nozzle 45 located adjacent the solder container 30 as shown in FIG. 3. A hot gas knife 46 is located adjacent the flux supplying station 44 and is adapted to supply hot gas, preferably nitrogen gas, for a purpose which will be described presently.

Following the gas knife 46 is a cooling station 47. The upper and lower cooling fans 48 and 50 may be provided, to cool the solder which has been applied and to form solder balls, also as will be explained presently.

As shown in FIG. 2, a washing and drying station 52 is provided for washing the metering band 10, a washing and drying station 54 is provided for washing the support band 22, and a washing and drying station 56 is provided for washing the flexible circuit 2 after the solder has been applied and formed into solder balls.

Operation of the device shown in FIGS. 2 and 3 is as follows. Solder 60 is supplied to the solder cavity 31 of the solder container 30, which can be supplied through the solder supply tube 32. This tube can be utilized periodically to replenish the solder as it is depleted during the operation. The pressure tube 34 applies a slight positive pressure by introducing a gas, preferably an inert gas such as nitrogen, on top of the solder 60 which is in the cavity. However, pressure may also be applied by maintaining a sufficient liquid solder head height in the cavity 31. The heaters 42 are utilized as needed to maintain the solder 60 in the cavity 31 at molten temperatures.

The flexible circuit 2 is introduced between the metering band 10 and the support band 22 of the apparatus, and the teeth 18 of the metering band 10 project through the indexing holes 8 of the flexible circuit 2 and the indexing holes 26 of the support band 22. As the roll 14 is driven, the metering band 18 is driven, thus driving the support band 22 together with the flexible circuit contained therebetween. The indexing holes 8 in the flexible circuit 2 serve to align the pads 6 of the flexible circuit with the metering openings 20 in the metering band 10. The indexing holes 26 in the support band 22 allow the support band 22 to be driven along with the metering band 10 and the flexible circuit 2.

As the flexible circuit is driven past the solder container 30, solder 60 is metered through the openings 20 in the metering band 10 and into contact with the pads 6 on the flexible circuit 2. The wiping surface 36, together with the top of the metering band 10, serve to meter and/or shear a precise amount of solder 62 into the openings 21 surrounding the pads 6.

As the metering band 10 continues to move the flexible circuit past the edge of the wiping surface 36, the solder starts to form in a ball. In order to assure that oxides don't form to prevent the formation of a proper solder ball, the flux station 44 is provided which has a flux nozzle 45 which meters flux onto the solder ball being formed. The hot gas knife 46 assures that the metered solder thereon remains liquid long enough to form into a ball 64 as shown at the right side of FIG. 3. The ball is formed when the solder is molten and the surface is free of dross or other material which will limit the formation of an essentially spherical ball 64.

Once the ball is formed into the configuration 64 as shown in FIG. 3, continued movement of the metering band 10 moves the flexible circuit 2 with the solder balls 64 thereon past the cooling station 47 which solidifies the solder balls 64 and allows them to emerge therefrom in a solid state. Continued movement of the metering band 10 releases the band 10 from the flexible circuit 2 which is moved through the washing station 56 to remove any flux or any unwanted material, and from the washing station 56 the flexible circuit 2 emerges with solder balls 64 formed thereon ready for whatever use to which it is to be put.

Thus, a technique for continuously applying solder to a substrate is provided wherein the solder is provided as a molten reservoir of solder material and as the flexible circuit 2 moves by the solder, it is metered onto the flexible circuit pads in a measured amount. The solder emerges from the solder container and the flexible circuit moves past the reservoir to form the desired solder ball, which is then cooled. The flexible substrate is then washed and ready for further operations, all in a continuous manner which provides a very high through put at a relatively low cost.

Figure 4:
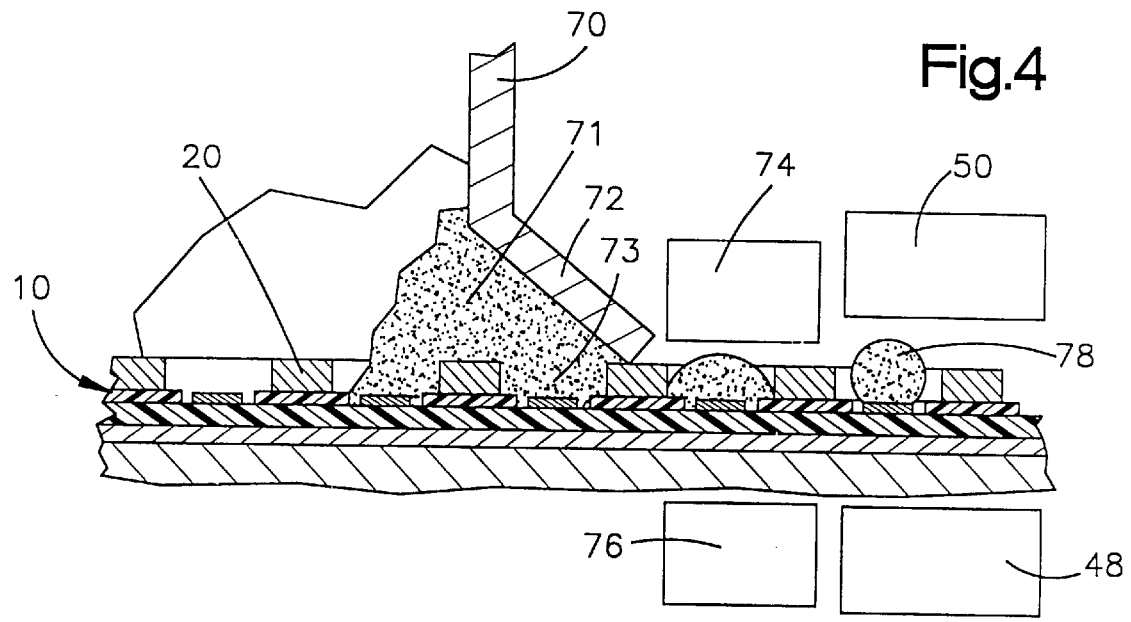
FIG. 4 is a detailed sectional view of another embodiment of the present invention for applying solder in a paste form to a substrate.

Referring now to FIG. 4, another embodiment of the present invention is shown wherein the solder is applied as a solder paste and then heated and reflowed to form solder balls. The apparatus for performing the invention shown in FIG. 4 is essentially the same as that shown in FIG. 2, except that instead of a container for liquid solder, a solder paste holder 70 is provided which holds a quantity of solder paste 71. The paste is applied to the substrate in a manner similar to that as shown in FIGS. 2 and 3, but since the solder is in the form of a paste and at ambient temperature, a wiper blade 72 is provided at the output side of the solder paste holder 70 to provide a metered amount of solder 73 in the openings 20 of the metering band 10. As the metering band 10, together with the flexible circuit 2 having the solder paste metered thereon, emerges from the solder paste holder 70, it passes by upper and lower heaters 74 and 76 which provide the heat to the paste to cause the solder paste to melt and form solder balls 78 which will solidify as they pass the cooling stations 48 and 50. The remainder of the device is the same, including the washing stations.

Figure 5:
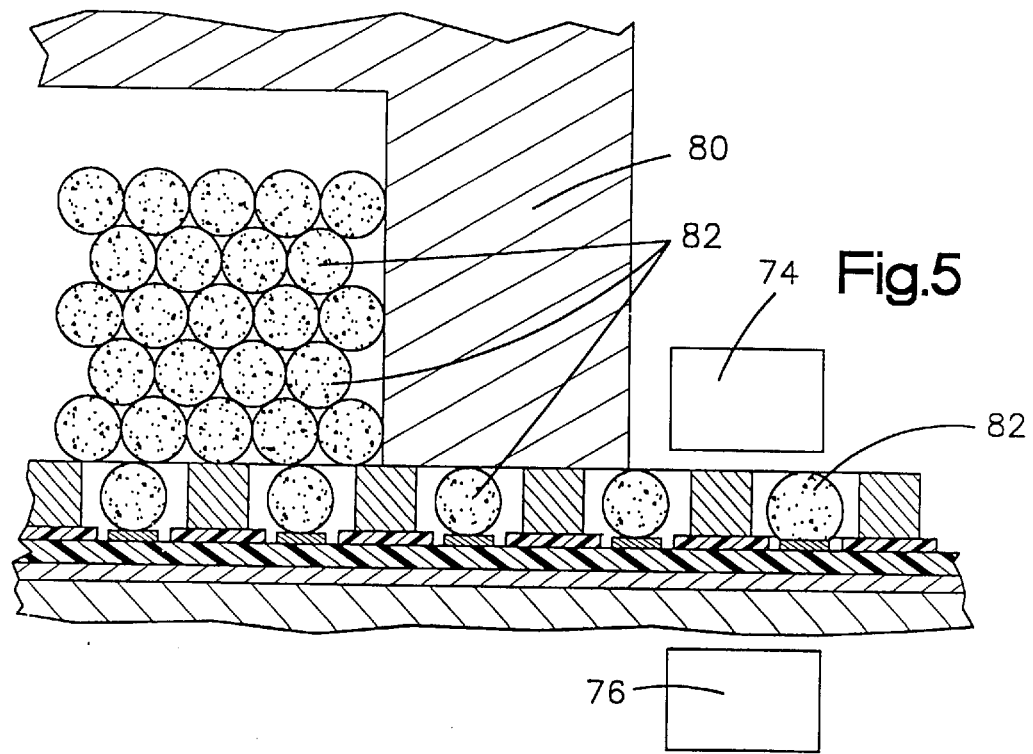
FIG. 5 is detailed sectional view of yet another embodiment for applying solder in the form of solid solder balls to a substrate.

FIG. 5 shows yet another embodiment of a device for dispensing solder in which a solder ball holder 80 is provided in which are stored solid solder spheres 82 of the desired size. As the metering band 10 passes under the solder ball holder 80, solder balls drop individually into each of the openings 20 of the metering band 10 and emerge from the solder ball holder 80, flux is then added and it then passes the upper and lower furnaces 74 and 76 wherein the solder is melted and reflowed to form solder balls. Various types of feeds may be used for delivering the solder balls, such as cascading the balls along the top of the band, until one falls into a hole. The melting, of course, is to adhere the solder balls 82 to the pads 6 on the flexible circuit 2.

Figure 6:
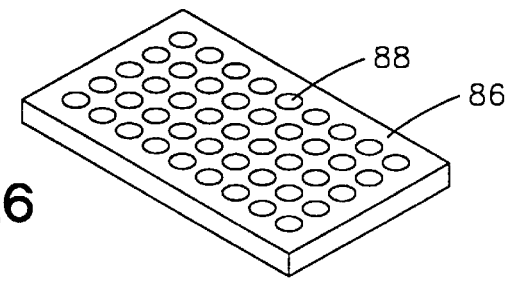
FIG. 6 is a perspective view of a relatively rigid substrate to which solder is applied according to another embodiment of this invention.

The various embodiments of the devices shown in FIGS. 2–5 are for use in applying solder to flexible circuits or other similar continuous thin bands of material. However, in some instances, it is desired to provide solder balls to discrete circuit boards or other rigid substrates such as integrated circuit chips, or wafers, or the like preselected pattern wherein the substrate is not continuous but is generally provided as relatively rigid discrete structures. A substrate of this type is shown in FIG. 6 and designated generally by the reference character 86. The substrate or module 86 is provided with a series of regularly spaced pads 88 thereon, to which solder balls are to be applied. To apply solder to these discrete boards, a modified support band 90 in FIG. 7, replaces the support band 22 shown in FIG. 2. In this embodiment, the support band 90 has a plurality of bottomed or through openings 92 which are configured to engage the modules or substrates 86 therein and the depth of the bottomed or through openings 92 are essentially the same depth as the thickness of the modules 86. In this case, there may or may not be indexing holes provided in the modules 86, however the lower band 90 is provided with index openings 94 which engage the teeth 18 of the metering band 10. The lower band 90 is then driven, supporting the modules 86 and the openings 92 therein which locate the modular 86 with respect to the openings 20 in the metering band 10. For rigid members, the conveyor may be a rotary conveyor such as a rotary table with a metering member that moves in contact with the table top during a portion of the rotation-and above the table top in another portion of the rotation for inserting and removing members and washing if required. In other aspects, the devices of FIGS. 2, 3, 4 and 5 are the same for applying solder either in liquid solder form, solder paste form or in solid solder ball form.

Figure 7:
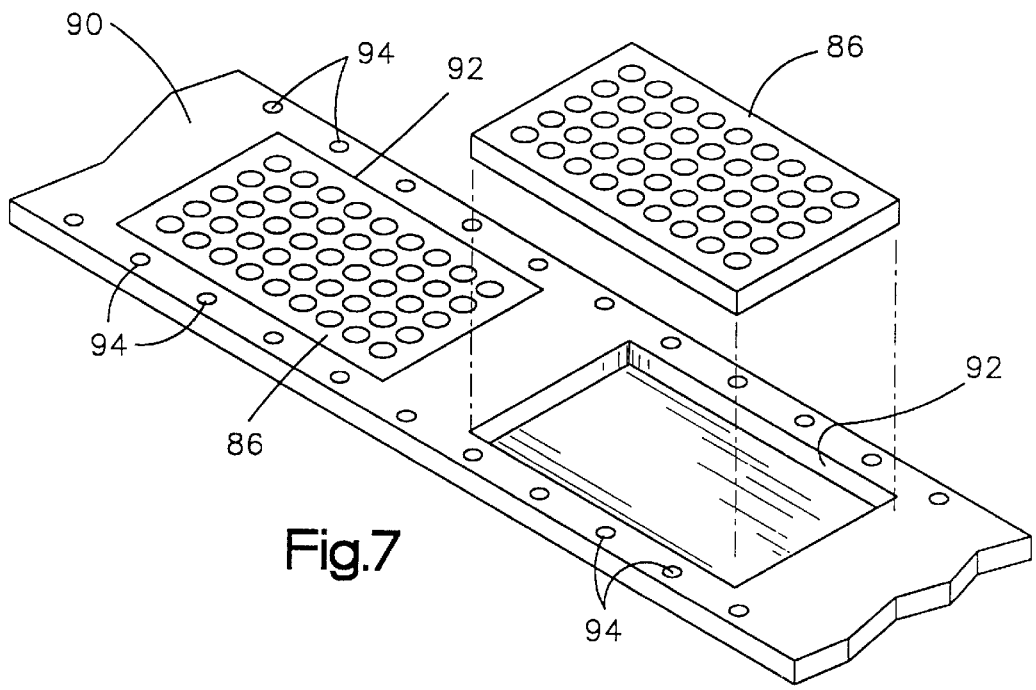
FIG. 7 is a partial sectional view of a support band for use in a device of the present invention for applying solder to the substrate shown in FIG. 6.
Figure 8:
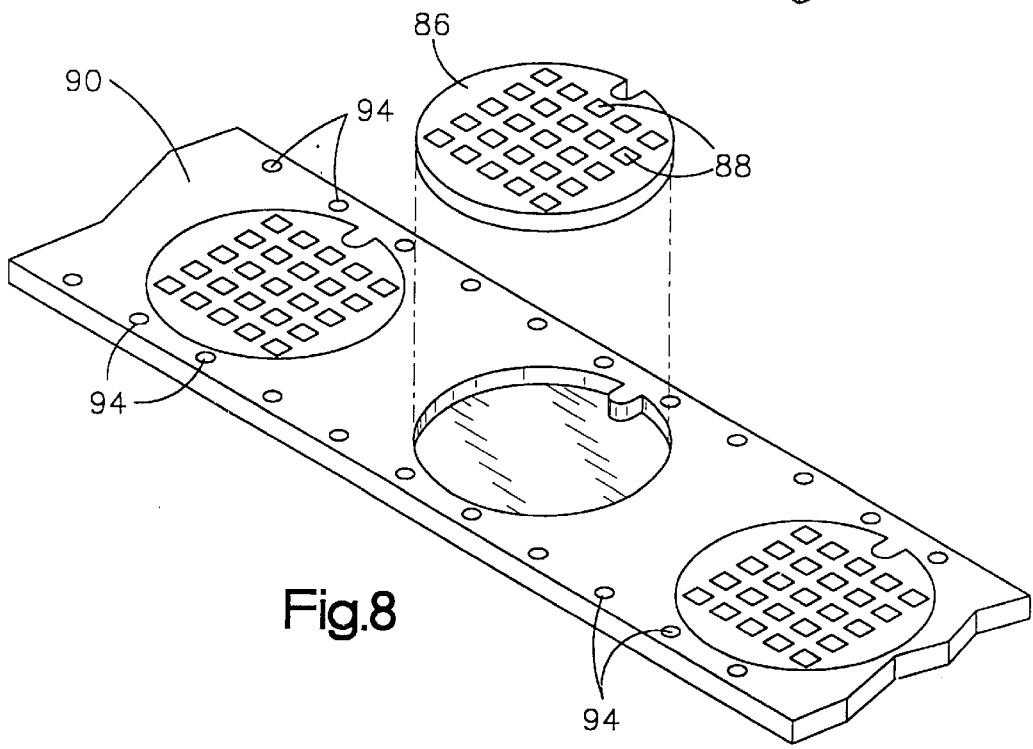
FIG. 8 is an alternate view of the portion section of FIG. 7.

FIG. 8 shows an alternate embodiment of FIG. 7 in which the discrete member is rigid circular member such as a semiconductor wafer. Accordingly, the preferred embodiment of the present invention has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A conveyor mechanism for applying solder to a substrate, which substrate has a predetermined pattern of solder receiving pads, comprising;

a support member, a continuous metering member,
   said metering member having through openings therein arranged in the predetermined pattern of said solder receiving pads, a drive mechanism to drive said metering member with said substrate disposed between said support member and said metering member, a solder dispersing device adjacent said metering member positioned to deliver solder to said metering member, a heating device to melt said solder, a registration mechanism to align said openings in said metering member with said pads on said substrate, and a coating device to solidify said liquid solder after it has been applied to said substrate.

2. The conveyor mechanism of claim 1 wherein said heating device is attached to said solder dispensing device, and said solder dispersing device holds and disperses liquid solder.

3. The conveyor mechanism of claim 1 wherein said solder dispensing device is configured to disperse solid solder balls to said melting device, and wherein said heating device is positioned to heat the solid solder balls after they have been dispersed.

4. The conveyor mechanism of claim 1 wherein said solder dispersing device is configured to disperse solder paste into said openings of said metering device and wherein said heating device is positioned to heat the solder paste after it is dispersed.

5. The conveyor mechanism as defined in claim 1 wherein said metering member is a continuous belt member driven by said drive mechanism.

6. The conveyor mechanism as defined in claim 1 wherein said support member is a continuous belt member.

7. The conveyor mechanism as defined in claim 5 wherein said registration member includes teeth on said metering member positioned to engage openings in said substrate.

8. The conveyor as defined in claim 6 wherein said support member is configured to mount said substrate in a given position, and said registration member includes teeth carried by said belt engagable with openings in said support member.

\* \* \* \* \*

UNITED STATES PATENT AND TRADEMARK OFFICE
CERTIFICATE OF CORRECTION

PATENT NO. : 6,027,006
DATED : February 22, 2000
INVENTOR(S) : Mark Vincent Pierson It is certified that error appears in the above-identified patent and that said Letters Patent is hereby corrected as shown below:

On the title page, please add the following:

Related U.S. Application Data

[62] Division of application No. 08/691,275, August 1, 1996, Pat. No. 5,938,106

Page 1, column 1, after the title, please add the following:

Related Applications

This is a Divisional of copending patent application Serial No. 08/691,275, filed August 1, 1996, now Patent No. 5,938,106.

Signed and Sealed this

Twenty-sixth Day of December, 2000

*Attest:*

Q. TODD DICKINSON

*Attesting Officer*      *Director of Patents and Trademarks*